US012638510B2

(12) United States Patent
Choi et al.

(10) Patent No.: US 12,638,510 B2
(45) Date of Patent: May 26, 2026

(54) BATTERY MANAGEMENT APPARATUS AND METHOD

(71) Applicant: LG ENERGY SOLUTION, LTD., Seoul (KR)

(72) Inventors: Ho-Deuk Choi, Daejeon (KR);
Yong-Min Park, Daejeon (KR);
Young-Hwan Jeon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 434 days.

(21) Appl. No.: 17/439,364

(22) PCT Filed: Sep. 25, 2020

(86) PCT No.: PCT/KR2020/013028
§ 371 (c)(1),
(2) Date: Sep. 14, 2021

(87) PCT Pub. No.: WO2021/060900
PCT Pub. Date: Apr. 1, 2021

(65) Prior Publication Data
US 2022/0158255 A1 May 19, 2022

(30) Foreign Application Priority Data

| Sep. 25, 2019 | (KR) | .......................... 10-2019-0118316 |
| Oct. 10, 2019 | (KR) | .......................... 10-2019-0125479 |
| Sep. 4, 2020 | (KR) | .......................... 10-2020-0113326 |

(51) Int. Cl.
*G01R 31/371* (2019.01)
*G01R 31/382* (2019.01)
(Continued)

(52) U.S. Cl.
CPC ......... *G01R 31/371* (2019.01); *G01R 31/382* (2019.01); *G01R 31/396* (2019.01);
(Continued)

(58) Field of Classification Search
CPC ........................... H01M 10/425; G01R 31/371
See application file for complete search history.

(56) References Cited

U.S. PATENT DOCUMENTS

| 2007/0140167 A1 | 6/2007 | Jang et al. |
| 2012/0173900 A1 | 7/2012 | Diab et al. |
| | | (Continued) |

FOREIGN PATENT DOCUMENTS

| CN | 105634636 A | 6/2016 |
| CN | 104627159 B | 4/2017 |
| | | (Continued) |

OTHER PUBLICATIONS

International Search Report issued in corresponding International Patent Application No. PCT/KR2020/013028, dated Jan. 26, 2021.
(Continued)

*Primary Examiner* — Abdeltif Ajid
(74) *Attorney, Agent, or Firm* — Morgan, Lewis & Bockius LLP

(57) ABSTRACT

The present disclosure is directed to providing a battery management apparatus and method, which may shorten a transmission time of a plurality of response information by flexibly selecting a communication channel. According to an aspect of the present disclosure, transmission efficiency for a plurality of response information may be improved because a communication channel may be flexibly selected according to a data amount of response information to be transmitted. In addition, according to an aspect of the present disclosure, there is an advantage that a communication channel may be flexibly selected according to a state of each of a plurality of communication channels as well as the data amount of response information.

21 Claims, 6 Drawing Sheets

(51) Int. Cl.

| | |
|---|---|
| *G01R 31/396* | (2019.01) |
| *H01M 10/42* | (2006.01) |
| *H01M 10/48* | (2006.01) |
| *H02J 7/80* | (2026.01) |
| *H04L 43/0888* | (2022.01) |
| *H04L 45/00* | (2022.01) |

(52) U.S. Cl.

CPC ....... *H01M 10/425* (2013.01); *H01M 10/482* (2013.01); *H01M 10/486* (2013.01); *H04L 43/0888* (2013.01); *H04L 45/70* (2013.01); *H01M 2010/4271* (2013.01); *H01M 2010/4278* (2013.01); *H02J 7/80* (2026.01)

(56) References Cited

U.S. PATENT DOCUMENTS

| | | | | |
|---|---|---|---|---|
| 2016/0121816 | A1* | 5/2016 | Koo | H04L 12/4013 |
| | | | | 370/476 |
| 2016/0149692 | A1 | 5/2016 | Kim et al. | |
| 2018/0330767 | A1* | 11/2018 | Lea | G11C 8/12 |
| 2019/0020716 | A1* | 1/2019 | Fukuchi | H04L 43/0811 |
| 2019/0068510 | A1 | 2/2019 | Endo et al. | |
| 2020/0064408 | A1* | 2/2020 | Sato | H01M 10/482 |
| 2020/0092196 | A1* | 3/2020 | Mizutani | H04L 45/24 |
| 2020/0269869 | A1 | 8/2020 | Fujihara et al. | |

FOREIGN PATENT DOCUMENTS

| | | | | | |
|---|---|---|---|---|---|
| CN | 207263897 | U | 4/2018 | | |
| CN | 109863639 | A | 6/2019 | | |
| EP | 2431885 | A1 * | 3/2012 | ............ | H04L 67/60 |
| JP | 2013-38711 | A | 2/2013 | | |
| JP | 2017-188793 | A | 10/2017 | | |
| JP | 2018-073691 | A | 5/2018 | | |
| KR | 10-2006-0067361 | A | 6/2006 | | |
| KR | 10-2007-0063920 | A | 6/2007 | | |
| KR | 10-1573637 | B1 | 12/2015 | | |
| KR | 10-2019-0013012 | A | 2/2019 | | |
| KR | 10-2019-0036134 | A | 4/2019 | | |
| KR | 10-2019-0046477 | A | 5/2019 | | |
| KR | 10-2019-0069421 | A | 6/2019 | | |
| WO | 2019/116795 | A1 | 6/2019 | | |

OTHER PUBLICATIONS

Extended European Search Report dated Jul. 18, 2022 issued by the European Patent Office in corresponding European Patent Application No. 20870249.8.

Office Action, dated Sep. 16, 2023, issued in corresponding CN Application No. 202080032035.7.

* cited by examiner

| Byte / Packet type | 1 | 2 | 3 | 4 | 5 | 6 | 7 | 8 |
|---|---|---|---|---|---|---|---|---|
| Message packet | Packet size information area | | Packet identification information area | Data area | | | | |

FIG. 5

| Byte<br>Packet type | 1 | 2 | 3 | 4 | 5 | 6 | 7 | 8 |
|---|---|---|---|---|---|---|---|---|
| Message packet | Packet size information area | | Packet identification information area | First response information | | Classification information | Second response information | |
| | Classification information | Third response information | | Classification information | Fourth response information | | Classification information | Fifth response information |
| | Fifth response information | Classification information | Sixth response information | | Classification information | Seventh response information | | Classification information |
| | Eighth response information | | Classification information | Ninth response information | | Classification information | Tenth response information | |
| | Classification information | Eleventh response information | | Classification information | Twelfth response information | | Classification information | Thirteenth response information |
| | Thirteenth response information | Classification information | Fourteenth response information | | Classification information | Fifteenth response information | | Classification information |
| | Sixteenth response information | | Classification information | Seventeenth response information | | Classification information | Eighteenth response information | |
| | Classification information | Nineteenth response information | | Classification information | twentieth response information | | Classification information | Classification information |

FIG. 6

| Byte / Packet type | 1 | 2 | 3 | 4 | 5 | 6 | 7 | 8 |
|---|---|---|---|---|---|---|---|---|
| Message packet | Packet size information area | | Packet identification information area | | First response information | | | Classification information |
| | Second response information | | Classification information | Third response information | | | | Classification information |
| | Fourth response information | | Classification information | Fifth response information | | | | Classification information |
| | Sixth response information | | Classification information | Seventh response information | | | | Classification information |
| | Eighth response information | | Classification information | Ninth response information | | | | Classification information |
| | Tenth response information | | Classification information | Eleventh response information | | | | Classification information |
| | Twelfth response information | | Classification information | Thirteenth response information | | | | Classification information |
| | Fourteenth response information | | Classification information | Fifteenth response information | | | | Classification information |

FIG. 7

| Packet type \ Byte | 1 | 2 | 3 | 4 | 5 | 6 | 7 | 8 |
|---|---|---|---|---|---|---|---|---|
| Message packet | Packet size information area | | Packet identification information area | First response information | | Classification information | Second response information | |
| Data packet | 20 | Classification information | Third response information | | Classification information | Fourth response information | | Classification information |
| Data packet | 21 | Fifth response information | | Classification information | Sixth response information | | Classification information | Seventh response information |
| Data packet | 22 | Seventh response information | Classification information | Eighth response information | | Classification information | Ninth response information | |
| Data packet | 23 | Classification information | Tenth response information | | Classification information | Eleventh response information | | Classification information |
| Data packet | 24 | Twelfth response information | | Classification information | Thirteenth response information | | Classification information | Fourteenth response information |
| Data packet | 25 | Fourteenth response information | Classification information | Fifteenth response information | | Classification information | Sixteenth response information | |
| Data packet | 26 | Classification information | Seventeenth response information | | Classification information | Eighteenth response information | | Classification information |

BATTERY MANAGEMENT APPARATUS AND METHOD

TECHNICAL FIELD

The present application claims priority to Korean Patent Application No. 10-2019-0118316 filed on Sep. 25, 2019, Korean Patent Application No. 10-2019-0125479 filed on Oct. 10, 2019, and Korean Patent Application No. 10-2020-0113326 filed on Sep. 4, 2020 in the Republic of Korea, the disclosures of which are incorporated herein by reference.

The present disclosure relates to a battery management apparatus and method, and more particularly, to a battery management apparatus and method for transmitting response information more effectively.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Meanwhile, a device equipped with the battery includes various electronic control units (ECUs), and the ECUs communicate with each other to provide information to or receive information from other ECUs. Seeing a vehicle as an example, various functions and controls are increasing in the vehicle, and particularly, data transmission/reception amount between the ECUs is increasing as an electric vehicle equipped with a battery becomes practical. Therefore, communication standards and technologies have been proposed to improve the efficiency of data communication between the ECUs.

For example, Patent Literature 1 discloses a technology that may change a data frame structure for CAN (Controller Area Network) communication to increase data amount so that data reception stability and communication speed are improved for better traffic load on a CAN bus.

However, Patent Literature 1 only discloses a configuration in which a data-receiving side changes a receiving mode to a high speed mode or a normal mode according to whether the data length exceeds 8 bytes. Since Patent Literature 1 improves the traffic load only by changing the reception mode, there is a problem that this technology is difficult to be applied to a device such as an electric vehicle in which various information on a battery cell must be provided in real time. That is, according to Patent Literature 1, there is a problem that a considerable amount of time may be required for data transmission, since a data-transmitting side must transmit single information on each battery cell individually.

(Patent Literature 1) KR 10-1573637 B1

DISCLOSURE

Technical Problem

The present disclosure is designed to solve the problems of the related art, and therefore the present disclosure is directed to providing a battery management apparatus and method, which may shorten a transmission time of a plurality of response information by flexibly selecting a communication channel.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a communication unit configured to receive an information provision request containing at least one request information about a battery cell or a battery pack; a measuring unit configured to measure at least one of voltage, current and temperature of the battery cell or the battery pack to correspond to the request information contained in the information provision request received by the communication unit; and a control unit configured to receive a measurement result measured by the measuring unit, generate at least one response information corresponding to the request information based on the received measurement result, select any one communication channel among a plurality of communication channels based on at least one of a data amount of the generated response information and a state of the plurality of communication channels, generate a message packet corresponding to the information provision request based on a type of the selected communication channel and the data amount of the generated response information, and output the generated message packet to the selected communication channel through the communication unit.

The control unit may be configured to calculate a packet data amount requested for the message packet based on the data amount of the generated response information and generate the message packet to contain packet size information for the calculated packet data amount, packet identification information and the generated response information.

The packet identification information may be identification information corresponding to the information provision request.

The message packet may include a packet size information area in which the packet size information is recorded, a packet identification information area in which the packet identification information is recorded, and a data area in which the generated response information is recorded.

The control unit may be configured to determine the packet data amount based on data amounts of the packet size information area, the packet identification information area and the data area.

When the response information is provided in plural, the control unit may be configured to classify the plurality of response information from each other by including classification information corresponding to the number of the plurality of response information in the data area.

The plurality of communication channels may include a first communication channel in which a maximum data amount of response information transmittable at once is set to be equal to or smaller than a predetermined first reference amount; and a second communication channel in which a maximum data amount of response information transmittable at once is set to be equal to or smaller than a predetermined second reference amount that is greater than the predetermined first reference amount.

The control unit may be configured to select the first communication channel among the plurality of communication channels, when the data amount of the response information is equal to or smaller than the predetermined first reference amount.

The control unit may be configured to select the second communication channel among the plurality of communication channels, when the data amount of the response information is greater than the predetermined first reference amount and equal to or smaller than the predetermined second reference amount.

The control unit may be configured to check a state of each of the first communication channel and the second communication channel, compare estimated transfer times respectively estimated to be taken for the first communication channel and the second communication channel to transmit the response information, and select a communication channel of which the estimated transfer time is shorter.

When the data amount of the response information is greater than the predetermined first reference amount but the first communication channel is selected, the control unit may be configured to generate a single message packet and a plurality of data packets, set the order of the plurality of generated data packets, and control the communication unit to sequentially output the generated message packet and the plurality of data packets through the first communication channel based on the set order.

The data packet may be configured to include an order area in which the set order information is recorded and a data area in which the response information is recorded.

The request information may be battery state information based on at least one of the voltage, the current and the temperature for the battery cell or battery pack diagnosis information based on at least one of the voltage, the current and the temperature for the battery pack.

In another aspect, the present disclosure may provide a battery pack, comprising the battery management apparatus according to an aspect of the present disclosure.

A battery management method according to another aspect of the present disclosure may comprise an information provision request receiving step of receiving an information provision request containing at least one request information about a battery cell or a battery pack; a measuring step of measuring at least one of voltage, current and temperature of the battery cell or the battery pack to correspond to the request information contained in the information provision request; a response information generating step of generating at least one response information corresponding to the request information based on a measurement result measured in the measuring step; a communication channel selecting step of selecting any one communication channel among a plurality of communication channels based on at least one of a data amount of the generated response information and a state of the plurality of communication channels; a message packet generating step of generating a message packet corresponding to the information provision request based on a type of the selected communication channel and the data amount of the generated response information; and a packet outputting step of outputting the generated message packet to the selected communication channel.

Advantageous Effects

According to an aspect of the present disclosure, transmission efficiency for a plurality of response information may be improved because a communication channel may be flexibly selected according to a data amount of response information to be transmitted.

In addition, according to an aspect of the present disclosure, there is an advantage that a communication channel may be flexibly selected according to a state of each of a plurality of communication channels as well as the data amount of response information.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 5 is a diagram showing an exemplary configuration of a message packet that may be output through a second communication channel.

FIG. 6 is a diagram showing another exemplary configuration of the message packet that may be output through the second communication channel.

FIG. 7 is a diagram showing an exemplary configuration of a message packet that may be output through a first communication channel.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
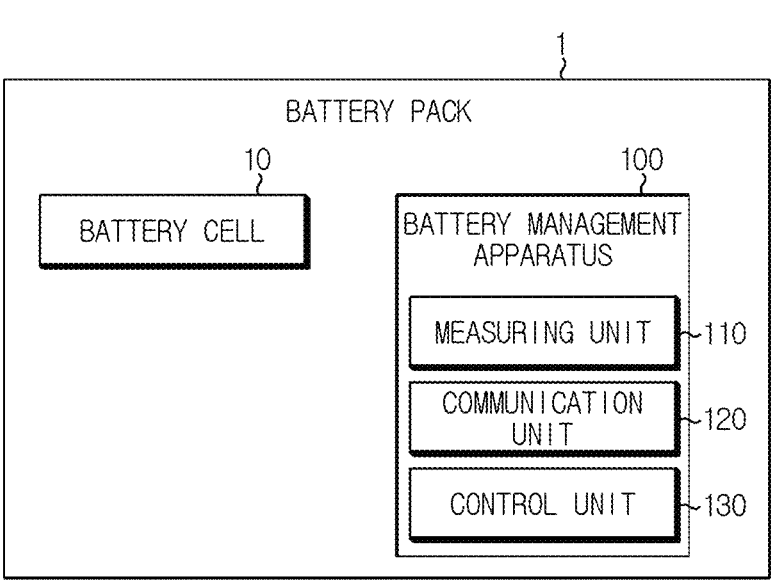
FIG. 1 is a diagram schematically showing a battery pack including a battery management apparatus according to an embodiment of the present disclosure.

FIG. 1 is a diagram schematically showing a battery pack 1 including a battery management apparatus 100 according to an embodiment of the present disclosure. Also, FIG. 2 is a diagram schematically showing an exemplary configuration of the battery pack 1 including the battery management apparatus 100 according to an embodiment of the present disclosure.

Figure 2:
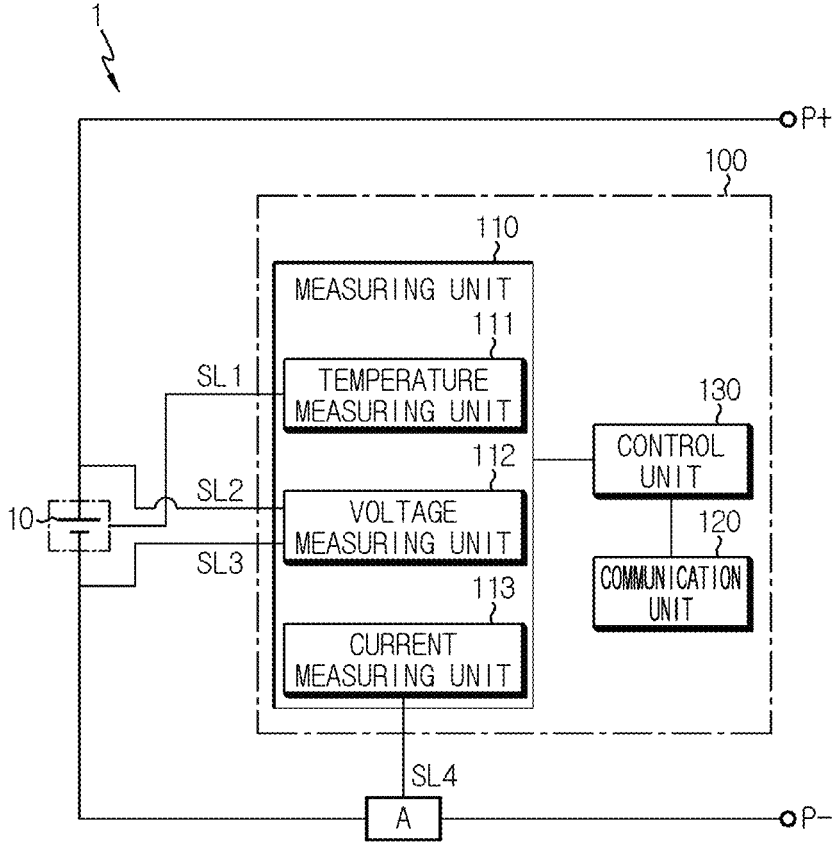
FIG. 2 is a diagram schematically showing an exemplary configuration of the battery pack including the battery management apparatus according to an embodiment of the present disclosure.

Referring to FIGS. 1 and 2, the battery pack 1 may include a battery cell 10 and a battery management apparatus 100.

Here, the battery cell 10 refers to one independent cell that has a positive electrode terminal and a negative electrode terminal and is physically separable. For example, one pouch-type lithium polymer cell may be regarded as the battery cell 10. In addition, the battery pack 1 may include a battery module in which two or more battery cells 10 are connected in series and/or in parallel. Hereinafter, for convenience of description, it will be described that one battery cell 10 is included in the battery pack 1.

The battery management apparatus 100 according to an embodiment of the present disclosure may include a measuring unit 110, a communication unit 120, and a control unit 130.

The measuring unit 110 may be configured to measure at least one of voltage, current and temperature of the battery cell 10 or the battery pack 1.

The measuring unit 110 may include individual units for measuring voltage, current and temperature of the battery cell 10 or the battery pack 1. For example, the measuring unit 110 may include a temperature measuring unit 111, a voltage measuring unit 112 and a current measuring unit 113.

The temperature measuring unit 111 may be a temperature sensor commonly used.

For example, referring to FIG. 2, the temperature measuring unit 111 may be electrically connected to the battery cell 10 through a first sensing line SL1. In addition, the temperature measuring unit 111 may measure the temperature of the battery cell 10 through the first sensing line SL1.

In addition, the temperature measuring unit 111 may measure an internal temperature of the battery pack 1.

The voltage measuring unit 112 may measure the voltage of the battery cell 10 by measuring a negative electrode potential and a positive electrode potential of the battery cell 10 and calculating a potential difference between the measured negative electrode potential and the measured positive electrode potential. In addition, the voltage measuring unit 112 may measure the voltage of the battery pack 1 by calculating a potential difference between a negative electrode terminal P+ of the battery pack 1 and a positive electrode terminal P− of the battery pack 1.

For example, referring to FIG. 2, the voltage measuring unit 112 may be connected to the negative electrode terminal of the battery cell 10 through a second sensing line SL2 and measure the negative electrode potential of the battery cell 10 through the second sensing line SL2. In addition, the voltage measuring unit 112 may be connected to the positive electrode terminal of the battery cell 10 through a third sensing line SL3 and measure the positive electrode potential of the battery cell 10 through the third sensing line SL3. In addition, the voltage measuring unit 112 may measure the voltage of the battery cell 10 by calculating a difference between the negative electrode potential and the positive electrode potential of the battery cell 10.

The current measuring unit 113 may measure the current of the battery cell 10 or the battery pack 1.

Specifically, the current measuring unit 113 may be electrically connected to a current measuring element A disposed on a charging and discharging path of the battery cell 10 and measure the current flowing in the charging and discharging path by means of the current measuring element A. Here, the charging and discharging path may be a large current path that connects the negative electrode terminal P+ of the battery pack 1, the battery cell 10, and the positive electrode terminal P− of the battery pack 1.

For example, referring to FIG. 2, the current measuring element A may be disposed between the positive electrode terminal of the battery cell 10 and the positive electrode terminal P− of the battery pack 1. Here, the current measuring element A may be an amperemeter or a shunt resistor. The current measuring unit 113 may be electrically connected to the current measuring element A through a fourth sensing line SL4. In addition, the current measuring unit 113 may measure the current flowing in the charging and discharging path by means of the current measuring element A connected to the fourth sensing line SL4.

Meanwhile, in the embodiment of FIG. 2, it is shown that the current measuring element A is disposed between the positive electrode terminal of the battery cell 10 and the positive electrode terminal P− of the battery pack 1, but the current measuring element A may be disposed at any place without limitation on the charging and discharging path of the battery cell 10. For example, in the embodiment of FIG. 2, the current measuring element A may be disposed between the negative electrode terminal of the battery cell 10 and the negative electrode terminal P+ of the battery pack 1. Even in this case, the current measuring unit 113 may be connected to the current measuring element A through the fourth sensing line SL4.

The control unit 130 may be configured to receive a measurement result measured by the measuring unit 110. Referring to FIG. 2, the control unit 130 may be connected to the measuring unit 110 and the communication unit 120. Preferably, the control unit 130 may be connected to the measuring unit 110 and the communication unit 120 through a wired line. In addition, the control unit 130 may receive the measurement result of at least one of voltage, current and temperature of the battery cell 10 from the measuring unit 110.

The communication unit 120 may be configured to receive an information provision request containing at least one request information about the battery cell 10 or the battery pack 1.

Specifically, the communication unit 120 may receive the information provision request for the battery cell 10 or the battery pack 1 from the outside of the battery management apparatus 100. That is, the battery management apparatus 100 may communicate with the outside through the communication unit 120.

Here, the request information may be battery state information based on at least one of the voltage, the current and the temperature for the battery cell 10, or battery pack diagnosis information based on at least one of the voltage, the current and the temperature for the battery pack 1.

Specifically, the battery state information may be at least one of voltage, current, temperature, SOC (State of Charge) and SOH (State of Health) of the battery cell 10.

In addition, the battery pack diagnosis information may be diagnosis information for the battery pack 1 itself, or diagnosis information for each of the components included in the battery pack 1. For example, the battery pack diagnosis information may include diagnosis information of the battery pack 1 based on any one of voltage, current and temperature.

For example, the request information of the information provision request received from the outside by the communication unit 120 may be battery state information, and the voltage information and the current information of the battery cell 10 may be included therein. That is, the communication unit 120 may receive an information provision request that requests to provide the voltage information and the current information of the battery cell 10 from the outside.

Meanwhile, preferably, the measuring unit 110 may be configured to measure at least one of voltage, current and temperature of the battery cell 10 or the battery pack 1 so as to correspond to the request information contained in the information provision request received by the communication unit 120.

The control unit 130 may be configured to generate at least one response information corresponding to the request information based on the measurement result received from the measuring unit 110. For convenience of explanation, the response information will be described later in detail.

The control unit 130 may be configured to select any one communication channel among a plurality of communication channels based on at least one of a data amount of the generated response information and a state of the plurality of communication channels.

Here, the plurality of communication channels may be various communication channels through which the response information generated by the control unit 130 may be transmitted. Specifically, the plurality of communications may be communication channels to which the communication unit 120 may be connected and through which the communication unit 120 may transmit the generated response information to the outside.

Specifically, the control unit 130 may select any one communication channel in consideration of whether the data amount of the generated response information is equal to or greater than a certain data amount or whether a part of the plurality of communication channels is already occupied and used.

For example, the plurality of communication channels may include a CAN (Controller Area Network) channel and a CAN FD (Controller Area Network with Flexible Data rate) channel. Here, the CAN channel may be a channel for CAN communication, and the CAN FD channel may be a channel for CAN FD communication.

In addition, the data amount of the response information may be different according to the request information. For example, the data amount of the response information may have a size of 2 bytes or 3 bytes according to the request information. Accordingly, the control unit 130 may calculate the data amount of the response information in consideration of the data amount and number of response information.

The control unit 130 may be configured to generate a message packet corresponding to the information provision request based on a type of the selected communication channel and the data amount of the generated response information.

Both CAN communication and CAN FD communication are communication standards designed to allow ECUs to communicate with each other without a separate host device. Therefore, the CAN communication and the CAN FD communication are separate communication standards, and thus packets used in the CAN communication and the CAN FD communication may have different structures.

For example, assuming that the control unit 130 selects a CAN channel among the plurality of communication channels, the control unit 130 may generate a message packet having a packet structure corresponding to the CAN channel. Conversely, assuming that the control unit 130 selects a CAN FD channel among the plurality of communication channels, the control unit 130 may generate a message packet having a packet structure corresponding to the CAN FD channel.

The control unit 130 may be configured to output the generated message packet to the selected communication channel through the communication unit 120.

The message packet generated to correspond to the type of the communication channel selected by the control unit 130 and the data amount of the response information may be a packet to be transmitted through the selected communication channel. That is, the control unit 130 may generate a message packet to have a packet structure corresponding to the type of the selected communication channel.

In addition, the control unit 130 may transmit a packet transmission command to the communication unit 120. The communication unit 120 receiving the packet transmission command from the control unit 130 may output the message packet generated by the control unit 130 to the communication channel selected by the control unit 130.

For example, it is assumed that the control unit 130 selects the CAN FD channel and generates a message packet corresponding to the CAN FD channel. If the communication unit 120 receives the packet transmission command from the control unit 130, the communication unit 120 may output the generated message packet to the CAN FD channel.

The battery management apparatus 100 according to the configuration of the present disclosure may more quickly provide the state information of the battery cell 10 by selecting an appropriate communication channel based on the state of the communication channel and the response information.

In addition, since the battery management apparatus 100 may be selectively connected to the plurality of communication channels, the battery management apparatus 100 has an advantage of being capable of communicating with the outside through various channels. That is, the battery management apparatus has an advantage of improving transmission efficiency of various response information by selecting an optimal communication channel among the plurality of communication channels.

Meanwhile, the control unit 130 provided to the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

Hereinafter, the response information that may be generated by the control unit 130 will be described in detail.

First, in the case where the battery state information is contained in the request information, the response information that may be generated by the control unit 130 will be described.

For example, it is assumed that the information provision request received by the communication unit 120 includes voltage request information, current request information and temperature request information of the battery cell 10. The control unit 130 may generate battery state information about the battery cell 10 based on the measurement result received from the measuring unit 110. Here, the battery state information may include the voltage information, the current information and the temperature information corresponding to the information provision request. In this case, the voltage information, the current information and the temperature information of the battery cell 10 generated by the control unit 130 may be the response information.

Specifically, the control unit 130 may receive the measurement result in the form of an electrical signal from the measuring unit 110. Accordingly, the control unit 130 may generate digital information corresponding to the voltage information, the current information and the temperature information of the battery cell 10 by interpreting and reading the electrical signal received from the measuring unit 110.

As another example, it is assumed that the SOC of the battery cell 10 is included in the information provision request received by the communication unit 120. Since the SOC of the battery cell 10 cannot be directly measured by the measuring unit 110, the control unit 130 may estimate the SOC of the battery cell 10 based on the measurement result received from the measuring unit 110. For example, the control unit 130 may estimate the SOC of the battery cell 10 based on the voltage and temperature of the battery cell 10, or may estimate the SOC of the battery cell 10 by integrating a current amount according to a charging and discharging time. In addition, the control unit 130 may generate information about the estimated SOC of the battery cell 10.

As another example, even when the SOH of the battery cell 10 is included in the information provision request received by the communication unit 120, the control unit 130 may estimate the SOH of the battery cell 10 based on the measurement result received from the measuring unit 110. In addition, the control unit 130 may generate information about the estimated SOH of the battery cell 10.

Next, in the case where the battery pack diagnosis information is included in the request information, the response information that may be generated by the control unit 130 will be described.

The control unit 130 may be configured to generate a diagnostic trouble code (DTC) corresponding to the battery pack 1 based on the measurement result received from the measuring unit 110. Here, the diagnostic trouble code is generated by referring to a preset diagnosis table, and may be generated with letters such as symbols and alphabets and/or numbers. For example, the diagnostic trouble code for the voltage of the battery cell 10 may be generated by referring to the diagnosis table for the voltage of the battery cell 10.

The control unit 130 may be configured to determine state information about a state change of the battery pack 1 based on the generated diagnostic trouble code.

Specifically, the state information may refer to state change information of the battery pack 1 that may be determined based on the diagnostic trouble code generated by the control unit 130. For example, the state information may include information about whether the state of the battery pack 1 determined based on the result measured by the measuring unit 110 is a defective pattern, a normal pattern or a healing pattern.

The control unit 130 may be configured to generate response information including the generated diagnostic trouble code and/or the determined state information. Preferably, the response information may include both the diagnostic trouble code and the state information.

For example, the response information generated by the control unit 130 may include the diagnostic trouble code indicating that the voltage of the battery cell 10 provided to the battery pack 1 at present is a high voltage and the state information indicating a defective pattern in which the voltage of the battery cell 10 continues to increase and thus the defect of the battery pack 1 is increasing.

More specifically, the measuring unit 110 may be configured to measure the state of the battery pack 1 corresponding to the information provision request multiple times at predetermined time intervals. Here, the state of the battery pack 1 may include at least one of voltage, current and temperature of the battery pack 1.

Preferably, the measuring unit 110 may measure the state of the battery pack 1 at every cycle set with a predetermined time interval. For example, if the battery pack 1 is provided in a vehicle, the measuring unit 110 may measure the state of the battery pack 1 at every driving cycle. More preferably, the measuring unit 110 may be configured to measure the state of the battery pack 1 at least three times.

The control unit 130 may be configured to generate a diagnostic trouble code for each state of the battery pack 1 measured multiple times. That is, the control unit 130 may generate a diagnostic trouble code about the measured state of the battery pack 1 whenever the measuring unit 110 measures the state of the battery pack 1.

For example, it is assumed that a first time point, a second time point and a third time point are time points selected at predetermined time intervals. The measuring unit 110 may measure the voltage of the battery cell 10 at the first time point, the second time point and the third time point. The control unit 130 may generate a first diagnostic trouble code based on the voltage of the battery cell 10 measured at the first time point. In addition, the control unit 130 may generate a second diagnostic trouble code based on the voltage of the battery cell 10 measured at the second time point. In addition, the control unit 130 may generate a third diagnostic trouble code based on the voltage of the battery cell 10 measured at the third time point.

In addition, the control unit 130 may be configured to determine the state information by analyzing a change pattern of the plurality of generated diagnostic trouble codes.

For example, it is assumed that the control unit 130 generates the first diagnostic trouble code, the second diagnostic trouble code and the third diagnostic trouble code for the voltage of the battery cell 10 according to the time sequence as in the former embodiment. The control unit 130 may analyze the change pattern of the first diagnostic trouble code, the second diagnostic trouble code and the third diagnostic trouble code. That is, the control unit 130 may analyze the voltage change pattern on whether the voltage of the battery cell 10 is increasing or decreasing according to the time sequence.

In addition, the control unit 130 may determine the state information of the battery pack 1 based on the analyzed pattern of the plurality of diagnostic trouble codes.

For example, the control unit 130 may determine the state information of the battery pack 1 as one of a defective pattern, a healing pattern and a normal pattern. More specifically, the control unit 130 may determine the state information of the battery pack 1 as one of a completely defective pattern, a defect progressing pattern, a normal pattern, a healing progressing pattern and a completely healed pattern.

Here, the completely defective pattern may be a pattern in which some or all of the components of the battery pack 1 are in a completely faulty state, and the completely defective pattern may have no possibility of recovering to a normal state even after time passes.

The defect progressing pattern is a pattern in which a defect is progressing in some or all of the components of the battery pack 1, and may be a state before the state information of the battery pack 1 is determined as the completely defective pattern.

The normal pattern may be a pattern in which all components of the battery pack 1 are kept in a normal state.

The healing progressing pattern may be a pattern in which some or all of the components of the battery pack 1 gradually change from a defective state to a normal state.

The completely healed pattern may be a pattern in which some or all of the components of the battery pack 1 are completely recovered from a defective state to a normal state.

That is, the battery management apparatus 100 according to an embodiment of the present disclosure may provide state change pattern information based on the state information of the battery pack 1 measured multiple times as well as the state at present according to the diagnostic trouble code of the battery pack 1. Therefore, there is an advantage in that more specific response information about the battery pack 1 may be provided.

The control unit 130 may be configured to digitize a state change degree of the battery pack 1 according to the plurality of generated diagnostic trouble codes with reference to a reference table.

Preferably, in the reference table, a plurality of reference ranges capable of digitizing the state change degree of the battery pack 1 according to the generated diagnostic trouble code may be set in advance. In addition, the control unit 130 may digitize the state change degree of the battery pack 1 by putting the generated diagnostic trouble code into the reference table.

For example, referring to the reference table, the state change degree of the digitized battery pack 1 may be within −128 to 127. Here, if the digitized state change degree is 0, it may mean that the state of the battery pack 1 is a normal state. In addition, as the digitized state change degree is closer to 127, it may mean that the battery pack 1 is in a state where the defect degree is increasing. In addition, as the digitized state change degree is closer to −128, it may mean that the battery pack 1 is in a state where the state of the battery pack 1 is recovering from a defective state to a normal state.

The control unit 130 may be configured to analyze an increase and decrease pattern for the digitized state change information.

For example, it is assumed that the digitized state change information of the battery pack 1 is 0 at the first time point, 50 at the second time point, and 127 at the third time point. The control unit 130 may analyze the increase and decrease pattern of the digitized state change information of the battery pack 1 as an increase pattern, based on the size change of the digitized state change information at the first time point, the second time point and the third time point.

The control unit 130 may be configured to determine the state information based on the analysis result.

For example, if the control unit 130 analyzes the increase and decrease pattern as an increase pattern as in the former embodiment, the control unit 130 may determine that the defect of the battery pack 1 is progressing. In addition, if the digitized state change information at the third time point is 127, the control unit 130 may determine that the state of the battery pack 1 is a completely defective state. That is, the control unit 130 may determine the state information of the battery pack 1 as a completely defective pattern.

As another example, if the digitized state change information of the battery pack 1 is 0 at all of the first time point, the second time point and the third time point, the control unit 130 may determine that the state of the battery pack 1 is a normal state. That is, the control unit 130 may determine the state information of the battery pack 1 as a normal pattern.

As still another example, it is assumed that the digitized state change information of the battery pack 1 is 0 at the first time point, 50 at the second time point, and −30 at the third time point. The control unit 130 may analyze the increase and decrease pattern of the digitized state change information of the battery pack 1 as an increasing and then decreasing pattern. Accordingly, the control unit 130 may determine the state information of the battery pack 1 as a healing progressing pattern.

In summary, if the digitized state change information increases over time, the control unit 130 may determine the state information of the battery pack 1 as a completely defective pattern or a defect progressing pattern. In addition, if the digitized state change information decreases over time, the control unit 130 may determine the state information of the battery pack 1 as a completely healed pattern or a healing progressing pattern. In addition, if the digitized state change information is kept constant at 0, the control unit 130 may determine the state information of the battery pack 1 as a normal pattern.

Here, if the digitized state change information is a maximum value (for example, 127), the control unit 130 may determine the state information of the battery pack 1 as a completely defective pattern. Conversely, if the digitized state change information is a minimum value (for example, −128), the control unit 130 may determine the state information of the battery pack 1 as a completely healed pattern.

The control unit 130 may provide a diagnosis result for the battery pack 1 by outputting the response information containing the generated diagnostic trouble code and the determined state information to the outside through the communication unit 120. That is, the control unit 130 may output the response information containing the generated diagnostic trouble code and the determined state information to the outside through the communication unit 120 in response to the battery pack diagnosis information included in the request information.

Therefore, the battery management apparatus 100 according to an embodiment of the present disclosure has an advantage of providing information about a defect progressing degree or a healing progressing degree for the battery pack 1. That is, based on the response information for the battery pack 1 generated by the battery management apparatus 100, the state of the battery pack 1 at next time point may be estimated or predicted, so the battery pack 1 may be managed more easily.

In the following, first, the message packet generated by the control unit 130 will be described.

The control unit 130 may be configured to calculate a packet data amount required for the message packet based on the data amount of the generated response information.

Here, the data amount of the response information may be a data size of the response information. For example, a fixed data size may be required for each response information.

It is assumed that the request information included in the information provision request is the voltage information, the current information and the temperature information of the battery cell 10 and the data size of each response information generated by the control unit 130 is 2 bytes. In this case, the total data amount of the response information corresponding to the request information contained in the information provision request may be 6 bytes.

The control unit 130 may generate the response information corresponding to the request information contained in the information provision request and calculate a packet data amount required for the message packet based on the total data amount of the generated response information before generating the message packet. That is, before generating the message packet, the control unit 130 may calculate the packet data amount in advance, allocate a memory required for the message packet, and then generate the message packet.

In addition, the control unit 130 may be configured to generate the message packet such that packet size information for the calculated packet data amount, packet identification information and the generated response information are included therein.

Here, the packet data amount may be the total data amount of the message packet. In addition, the packet identification information may be identification information corresponding to the information provision request. That is, the packet identification information may be a service ID (Identification) corresponding to the information provision request. For example, if the communication unit 120 receives the information provision request containing the request information, the packet identification information corresponding to the response information may be set to 0x22.

Therefore, a receiving side may find a final destination of the message packet by checking the packet identification information contained in the message packet. For example, an external device that transmits an information provision request for request information to the battery management apparatus 100, particularly the communication unit 120, may receive the message packet output through the communication unit 120, and if the packet identification information contained in the message packet is 0x22, the external device may determine that the corresponding message packet is the information requested by itself. In addition, the external device may store the corresponding message packet.

The control unit 130 may select a communication channel based on the data amount of the response information. In addition, as the data amount of the response information increases, the total data amount of the message packet may also increase.

Accordingly, before generating a message packet, the battery management apparatus 100 may figure out the data amount of the response information, select a communication channel, and generate a message packet corresponding to the type of the communication channel and the data amount of the response information. As a result, a communication channel corresponding to the data amount of the response information is selected, and a message packet corresponding thereto is generated, thereby improving the response information transmission efficiency.

The message packet may be configured to include a packet size information area in which the packet size information is recorded, a packet identification information area in which the packet identification information is recorded, and a data area in which the generated response information is recorded.

Figures 3, 4:
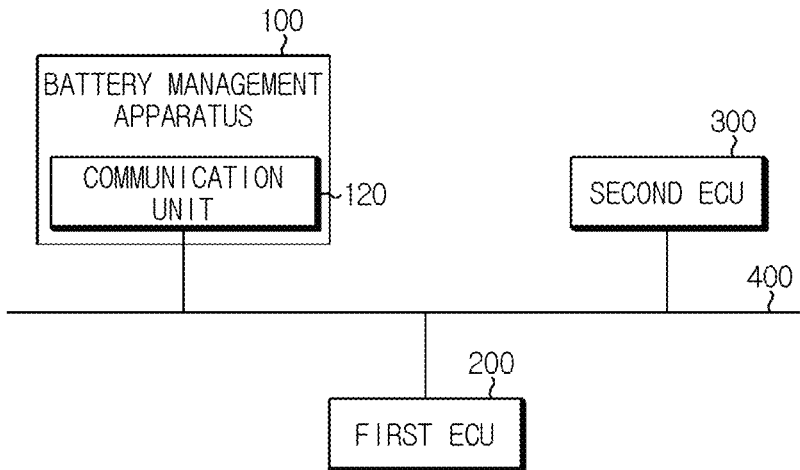
FIG. 3 is a diagram showing an exemplary configuration of a message packet that may be generated by the battery management apparatus according to an embodiment of the present disclosure.
FIG. 4 is a diagram showing an exemplary configuration in which the battery management apparatus according to an embodiment of the present disclosure is connected to a communication BUS.

FIG. 3 is a diagram showing an exemplary configuration of a message packet that may be generated by the battery management apparatus 100 according to an embodiment of the present disclosure.

For example, referring to FIG. 3, basically, the message packet may be an 8 byte packet including the packet size information area, the packet identification information area and the data area. Here, the packet size information area may be an area in which a DLC (Data Length Code) for the total data amount included in the message packet is recorded.

The packet size information area is an area in which information about the total data amount of the message packet is recorded. For example, the size of the packet size information area may be allocated as 1 byte or 2 bytes. Hereinafter, it will be described that the size of the packet size information area is fixedly allocated as 2 bytes.

Since the size of the packet size information area may be set according to the data amount of the response information, the control unit 130 may calculate the data amount of the response information first and then calculate the size of the packet size information area.

In addition, the packet identification information area is an area in which the identification information corresponding to the information provision request is recorded. In addition, the data area is an area in which the response information is recorded. For example, if the request information is included in the information provision request as in the former embodiment, packet identification information of 0x22 may be recorded in the packet identification information area. That is, the packet identification information area may be an area to which the data amount is fixedly allocated. Preferably, the data amount of the packet identification information area may be allocated as 1 byte or 2 bytes.

For example, in the embodiment of FIG. 3, 1 byte may be allocated to the packet identification information area. As another example, unlike the embodiment of FIG. 3, 2 bytes may also be allocated to the packet identification information area.

The response information may be recorded in the data area. For example, the data amount allocated to the data area may correspond to the total data amount of the response information generated by the control unit 130.

In addition, the control unit 130 may be configured to determine the packet data amount based on the data amounts of the packet size information area, the packet identification information area and the data area.

That is, the control unit 130 may first generate the response information and then allocate the data amount of the data area based on the total data amount of the generated response information. In addition, the control unit 130 may calculate the packet data amount required for the message packet by adding the data amount of the data area and the data amount of the packet identification information area and further adding the data amount of the packet size information to be recorded in the packet size information area.

For example, in the embodiment of FIG. 3, it is assumed that the data amount of the packet size information area is 2 bytes, the data amount of the packet identification information area is 1 byte, and the data amount of the data area is 5 bytes. The control unit 130 may calculate the packet data amount as 8 bytes by adding the data amounts of all areas.

If the response information is provided in plural, the control unit 130 may be configured to classify the plurality of response information from each other by including classification information corresponding to the number of the plurality of response information in the data area.

Here, the classification information may be dummy data for classifying the plurality of response information. In order for the receiving side to easily acquire each of the plurality of response information from the received message packet, the control unit 130 may allow the data area to include the classification information corresponding to the number of the plurality of response information. That is, the classification information may be a classification identifier for classifying the plurality of response information included in the data area from each other.

For example, it is assumed that the response information generated by the control unit 130 is voltage information and SOC information of the battery cell 10, and the data amount of the response information is 2 bytes, respectively. In the embodiment of FIG. 3, among 5 bytes of the data area, 4 bytes may be used to record the response information. At this time, the control unit 130 may record the voltage information of the battery cell 10 in the fourth byte and the fifth byte, record the classification information in the sixth byte, and record the SOC information of the battery cell 10 in the seventh byte and the eighth byte.

Accordingly, since the battery management apparatus 100 further includes the classification information in the message packet so that the receiving side may easily classify the plurality of response information from each other in a situation where it is necessary to transmit a message packet containing a plurality of response information, there is an advantage in that the response information may be delivered accurately.

The plurality of communication channels may include a first communication channel and a second communication channel. Here, the first communication channel may be a communication channel in which a maximum data amount of the response information transmittable at once is set to be equal to or smaller than a predetermined first reference amount. In addition, the second communication channel may be a communication channel in which a maximum data amount of the response information transmittable at once is set to be equal to or smaller than a predetermined second reference amount that is greater than the predetermined first reference amount.

Specifically, the first communication channel may be a channel in which the total data amount of the message packet transmittable at once is set to be smaller than the total data amount of the message packet transmittable at once by the second communication channel.

For example, the first communication channel may be a CAN channel, and the second communication channel may be a CAN FD channel. The CAN FD channel is a communication standard developed to compensate for the shortcomings of the CAN channel, and the data amount included therein to the maximum is greater than that of the CAN channel. For example, if the data amount includable in a packet transmitted through the CAN channel is 8 bytes at maximum, the data amount includable in a packet transmitted through the CAN FD channel may be 64 bytes at maximum. In addition, the response information may correspond to a DID (Data Identifier) in the CAN communication and the CAN FD communication.

In addition, the communication unit 120 may be connected to both the first communication channel and the second communication channel and communicate with an external device using both channels.

FIG. 4 is a diagram showing an exemplary configuration in which the battery management apparatus 100 according to an embodiment of the present disclosure is connected to a communication BUS 400.

Referring to FIG. 4, the battery management apparatus 100 may be connected to the communication BUS 400. In particular, the communication unit 120 may be connected to the communication BUS 400. That is, the communication unit 120 may receive the information provision request and transmit the message packet through the communication BUS 400.

In addition, a plurality of electronic control units (ECUs) may be connected to the communication BUS 400. For example, the plurality of ECUs may be ECUs included in a vehicle. The type of ECU is not limited, and the ECU may include ACU (Airbag Control Unit), BCM (Body Control Module), ECU (Engine Control Unit), PCM (Powertrain Control Module), TCU (Transmission Control Unit), ABS (Anti-lock Braking System), ESC (Electronic Stability Control), HPCU (Hybrid Power Control Unit), BMS (Battery Management System), MCU (Motor Control Unit) or the like. In addition, the battery management apparatus according to an embodiment of the present disclosure may be included in the BMS among the ECUs included in the vehicle. In the embodiment of FIG. 4, it is illustrated that a first ECU 200 and a second ECU 300 are connected to the communication BUS 400, but the communication BUS 400 may be connected to all of the plurality of aforementioned ECUs in parallel.

Referring to the embodiment of FIG. 4, the plurality of ECUs and the battery management apparatus 100 may be connected to the communication BUS 400 in parallel. That is, the communication channel may not be a point-to-point type channel that connects a plurality of terminals (the ECUs and the battery management apparatus 100) in one-to-one relationship, but may be a multi-master type channel that connects a plurality of terminals to one communication BUS 400 in parallel.

Both a message packet corresponding to the first communication channel and a message packet corresponding to the second communication channel may be output to the communication BUS 400. In this case, the message packet corresponding to the first communication channel may be received by an ECU that may be connected to the first communication channel, and the message packet corresponding to the second communication channel may be received by an ECU that may be connected to the second communication channel. Since the battery management apparatus 100 may be connected to both the first communication channel and the second communication channel, it is possible to transmit and receive both the message packet corresponding to the first communication channel and the message packet corresponding to the second communication channel.

Therefore, since the battery management apparatus 100 may access the first communication channel and the second communication channel through the communication unit 120, there is an advantage of being able to select a communication channel most suitable for transmitting the response information based on at least one of the data amount of the response information and the state of the plurality of communication channels.

Preferably, the control unit 130 may be configured to select the first communication channel among the plurality of communication channels if the data amount of the response information is equal to or smaller than the predetermined first reference amount.

For example, in the embodiment of FIG. 3, the predetermined first reference amount may be set to 4 bytes. In this case, if the data amount of the response information generated by the control unit 130 is 4 bytes or less, the generated response information may be included in the message packet of FIG. 3, so the control unit 130 may be configured to select the first communication channel.

That is, the control unit 130 may select any one of the plurality of communication channels according to whether the generated response information may be included in one message packet illustrated in FIG. 3.

In addition, the control unit 130 may be configured to select the second communication channel among the plurality of communication channels if the data amount of the response information is greater than the predetermined first reference amount and is equal to or smaller than the predetermined second reference amount.

As described above, the second communication channel may be a channel in which the data amount of the response information transmittable at one time is greater than or equal to the first reference amount and smaller than or equal to the second reference amount.

For example, it is assumed that the data amount of one response information generated by the control unit 130 is 2 bytes and the number of response information is 3 or more. In this case, the data amount of the response information may be greater than 4 bytes, which is the first reference amount. That is, since all of the response information generated by the control unit 130 cannot be included in the message packet shown in FIG. 3, the control unit 130 has no choice but to generate two message packets. Therefore, if the data amount of the response information is greater than the first reference amount, the control unit 130 may select the second communication channel.

FIG. 5 is a diagram showing an exemplary configuration of a message packet that may be output through a second communication channel.

Referring to FIG. 5, a maximum data amount of the message packet that may be output through the second communication channel may be 64 bytes.

For example, if the request information received by the communication unit 120 includes the battery state information, the size of one response information generated by the control unit 130 may be 2 bytes. In this case, 20 response information may be included at maximum in the message packet that may be output through the second communication channel.

As another example, if the request information received by the communication unit 120 includes the battery pack diagnosis information, the size of one response information generated by the control unit 130 may be 3 bytes. In this case, unlike the embodiment of FIG. 3, 15 response information may be included at maximum in the message packet that may be output through the second communication channel.

If the control unit 130 generates a message packet for 20 response information, each having a size of 2 bytes, using the configuration of the message packet shown in FIG. 3, 10 message packets may be generated at maximum. That is, in order to transmit 20 response information, the control unit 130 needs to output a message packet 10 times through the communication unit 120.

Accordingly, the control unit 130 may first check the data amount of the generated response information, and then select a communication channel for transmitting the message packet as the second communication channel if the checked data amount is greater than the first reference amount.

For example, if 20 response information are generated by the control unit 130 as in the former embodiment, the generated 20 response information may be recorded in one message packet as shown in FIG. 5. Specifically, 20 response information may be recorded in the data area of the message packet. In addition, the control unit 130 may include classification information between the plurality of response information, so that the receiving side may classify and identify each response information.

Therefore, the battery management apparatus 100 according to an embodiment of the present disclosure has an advantage of efficiently providing response information by flexibly selecting an appropriate communication channel based on the data amount of the response information.

For example, if the battery management apparatus 100 is provided in a vehicle, the response information must be quickly transmitted in real time while the vehicle is running. In this case, if a plurality of response information are transmitted using the configuration of the message packet shown in FIG. 3, it may take a long time to generate and transmit a plurality of message packets. Accordingly, the battery management apparatus 100 has an advantage of quickly transmitting the plurality of response information by flexibly selecting a communication channel based on the data amount of the generated response information.

In addition, the control unit 130 may be configured to check a state of each of the first communication channel and the second communication channel.

The control unit 130 may not select a communication channel based only on the data amount of the generated response information, but may select a communication channel for transmitting response information after checking the state of each of the plurality of communication channels.

For example, as in the embodiment of FIG. 4, the first ECU 200 and the second ECU 300 as well as the battery management apparatus 100 may be connected to the communication BUS 400. Accordingly, the control unit 130 may check whether there is a communication channel that is being used by another ECU among the first communication channel and the second communication channel by checking the state of each of the first communication channel and the second communication channel.

The control unit 130 may compare an estimated transfer time that is estimated to be required for each of the first communication channel and the second communication channel to transmit the response information.

For example, if the first communication channel is not used by another connected ECU but the second communication channel is used by another connected ECU, the control unit 130 may determine that the estimated transfer time of the response information using the first communication channel is shorter than the estimated transfer time of the response information using the second communication channel.

In addition, the control unit 130 may be configured to select a communication channel having a short estimated transfer time.

That is, the control unit 130 may select a communication channel through which the response information may be transmitted most quickly to the receiving side by considering all of the states of the plurality of communication channels as well as the data amount of the response information.

It is assumed that the number of response information generated by the control unit 130 is 20 as in the embodiment of FIG. 5. In order to transmit the generated 20 response information, the control unit 130 needs to generate 10 message packets of FIG. 3 when using the first communication channel, but the control unit 130 may generate 1 message packet of FIG. 5 when using the second communication channel. In this case, the control unit 130 may compare the estimated transfer time that is expected to be taken when transmitting 10 message packets using the first communication channel with the estimated transfer time that is expected to be taken when transmitting one message packet using the second communication channel. If the first communication channel is not being used by other connected ECUs and thus the control unit 130 may immediately output 10 message packets through the communication unit 120, but if the second communication channel is used by other connected ECUs and a plurality of message packets to be transmitted are also stored in the buffer of the second communication channel, the control unit 130 may transmit the generated 10 message packets using the first communication channel.

As described above, the battery management apparatus 100 according to an embodiment of the present disclosure has an advantage of being able to select a communication channel capable of transmitting response information in the shortest time by checking the data amount of the generated response information and the state of each of the plurality of communication channels. That is, the battery management apparatus 100 has an advantage of not only being able to communicate using a plurality of communication channels but also being able to flexibly select a communication channel capable of providing the fastest the response information to the receiving side among the plurality of communication channels.

FIG. 6 is a diagram showing another exemplary configuration of the message packet that may be output through the second communication channel.

Specifically, FIG. 6 is a diagram showing another exemplary configuration of the message packet for the second communication channel.

Referring to FIG. 6, 2 bytes may be allocated to the packet identification information area. In addition, the size of each of the plurality of response information may be 3 bytes. The classification information having a size of 1 byte may be included between the plurality of response information in the data area. That is, 15 response information and 15 classification information may be included in the data area.

Preferably, the response information in the embodiment of FIG. 5 may be battery state information, and the response information in the embodiment of FIG. 6 may be battery pack diagnosis information.

For example, when it is intended to transmit 15 response information of FIG. 6 using the message packet structure of FIG. 3, a total of 15 message packets must be generated, and the control unit 130 must command to output a total of 15 message packets through the communication unit 120. In this case, the communication time required to transmit a plurality of message packets may be significantly longer, compared to the case of using the message packet structure of FIG. 6.

Therefore, since the battery management apparatus according to an embodiment of the present disclosure selects a communication channel in consideration of the data amount to be transmitted, there is an advantage of saving time required for communication.

If the data amount of the response information is greater than the predetermined first reference amount but the first communication channel is selected, the control unit 130 may generate one message packet and a plurality of data packets.

In general, if the data amount of the response information is greater than the predetermined first reference amount, the control unit 130 may select the second communication channel for transmission efficiency of the response information. Since the second communication channel is a channel through which the message packet shown in FIG. 5 may be transmitted as described above, the control unit 130 may select the second communication channel if the data amount of the response information is greater than the predetermined first reference amount.

However, if the data amount of the response information is greater than the predetermined first reference amount but the estimated transfer time when using the second communication channel is greater than the estimated transfer time when using the first communication channel because the second communication channel is already used by another ECU, the control unit 130 may select the first communication channel as a communication channel for transmitting the response information.

In this case, the control unit 130 may generate one message packet and a plurality of data packets in order to provide the response information to the receiving side more quickly.

Here, the message packet may have the same configuration as the message packet shown in FIG. 3. In addition, the data packet may be a packet in which response information not included in the data area of the message packet among the plurality of response information generated by the control unit 130 is stored. The message packet and the data packet will be described with reference to FIG. 7.

FIG. 7 is a diagram showing an exemplary configuration of a message packet that may be output through a first communication channel.

Referring to FIG. 7, the biggest difference between the message packet and the data packet is that the packet size information area and the packet identification information area included in the message packet are not included in the data packet. That is, the data packet may have a structure in which the packet size information area and the packet identification information area are omitted in order to include more response information not included in the message packet.

For example, in the embodiment of FIG. 7, it is assumed that the control unit 130 generates 18 response information and the size of each response information is 2 bytes. Since the data area of the message packet may include 2 response information at maximum, including classification information, described above, the remaining 16 response information are not able to be stored in the data packets.

In this case, if the control unit 130 uses the message packet of FIG. 3, it is needed to generate 8 message packets additionally for the remaining 16 response information. Meanwhile, if the control unit 130 uses the data packet of FIG. 7, the control unit 130 may generate just 7 data packets additionally for the remaining 16 response information.

That is, if the size of the generated response information is greater than the first reference amount but the first communication channel is selected based on the result of checking a plurality of communication channels, the control unit 130 may be configured to transmit a single message packet and a plurality of data packets for rapid transmission of the generated response information.

In addition, the control unit 130 may be configured to set the order of the plurality of generated data packets.

Specifically, the control unit 130 may set the order for each of the plurality of data packets to control the flow of the plurality of generated data packets.

For example, if the order is not set for the plurality of data packets, the receiving side may sequentially read the plurality of data packets according to the order of reception. In this case, if the transmission order of the plurality of data packets is reversed in the communication process due to an unexpected reason, a fatal problem occurs that the receiving side cannot accurately read the response information generated by the control unit 130. Accordingly, in order to solve this problem, the control unit 130 may set the order for the plurality of generated data packets and record the set order in an order area of the data packet. After receiving the message packet and the plurality of data packets, the receiving side may accurately receive the response information by checking the order information included in each of the plurality of data packets.

For example, in the embodiment of FIG. 7, an order area in which the order information is recorded may be included in a start area of the data packet, and a data area in which the response information is recorded may be included next to the order area. For example, it is assumed that a data packet with the order information of 21 and a data packet with the order information of 22 are transmitted to the receiving side. In this case, the receiving side may read the seventh response information by connecting data recorded in the eighth byte of the data packet having the order information of 21 and data recorded in the second byte of the data packet having the order information of 22. If the receiving order of the plurality of data packets is changed in a state where the order information is not recorded in the plurality of data packets, there is a problem that the receiving side cannot accurately read the seventh response information. Accordingly, the control unit 130 may set the order information for each of the plurality of data packets in order to accurately transmit the plurality of response information.

In addition, the control unit 130 may be configured to control the communication unit 120 to sequentially output the generated message packet and the plurality of data packets through the first communication channel according to the set order.

Specifically, the control unit 130 may first output the message packet through the first communication channel and then sequentially output the plurality of data packets according to the set order by controlling the communication unit 120.

Therefore, the message packet and the plurality of data packets may reach the receiving side according to the output order, and even if a problem occurs in the communication process, the receiving side may accurately read the response information generated by the control unit 130 according to the set order.

The battery management apparatus 100 according to an embodiment of the present disclosure may be applied to a battery management system (BMS). That is, the BMS according to the present disclosure may include the battery management apparatus 100 described above. In this configuration, at least some components of the battery management apparatus 100 may be implemented by supplementing or adding functions of components included in a conventional BMS. For example, the measuring unit 110, the communication unit 120 and the control unit 130 of the battery management apparatus 100 may be implemented as components of the BMS. In addition, the BMS may be implemented to further include a balancing unit for balancing at least one battery cell and an insulation resistance measuring unit for measuring an insulation resistance of the battery cell, in addition to the configuration included in the battery management apparatus 100.

Figure 8:
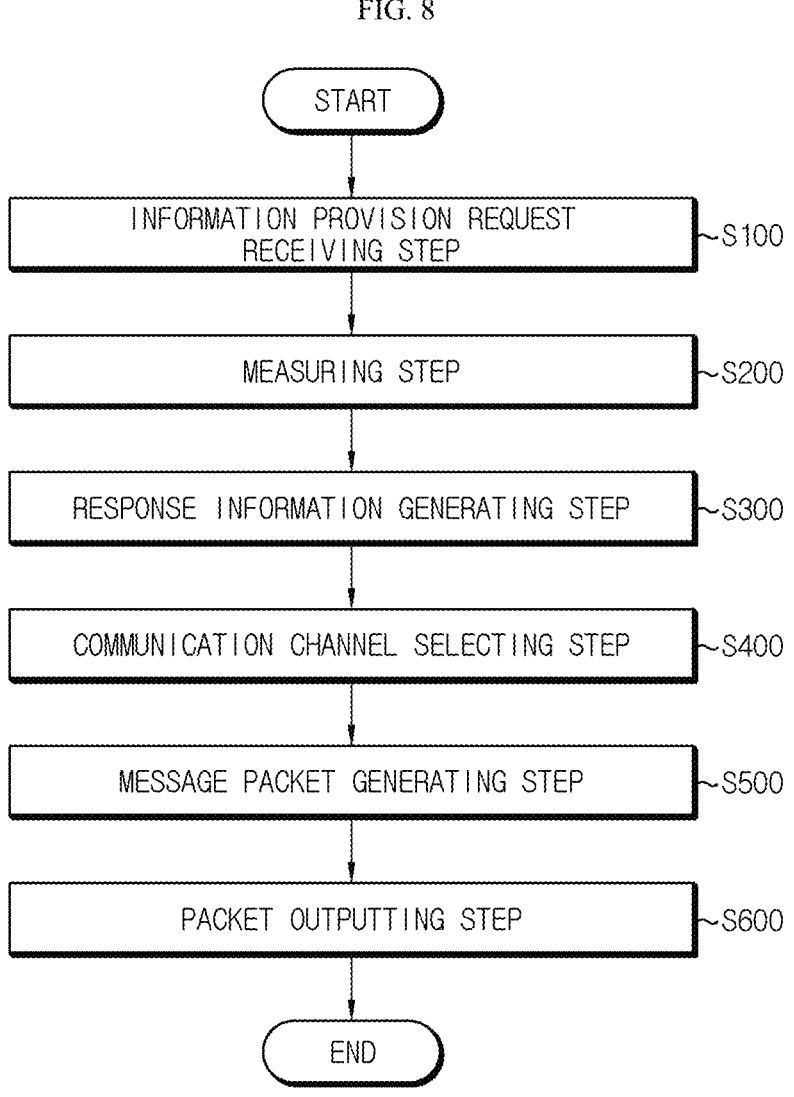
FIG. 8 is a diagram schematically showing a battery management method according to another embodiment of the present disclosure.

FIG. 8 is a diagram schematically showing a battery management method according to another embodiment of the present disclosure. Each step of the battery management method may be operated by the battery management apparatus 100 according to an embodiment of the present disclosure.

Referring to FIG. 8, the battery management method may include an information provision request receiving step (S100), a measuring step (S200), a response information generating step (S300), a communication channel selecting step (S400), a message packet generating step (S500), and a packet outputting step (S600).

The information provision request receiving step (S100) is a step of receiving an information provision request containing at least one request information for the battery cell 10, and may be performed by the communication unit 120.

The communication unit 120 may be connected to the communication BUS 400 to which the battery management apparatus 100 and at least one ECU are connected. In addition, the communication unit 120 may receive an information provision request for the request information from at least one ECU connected to the communication BUS 400.

Here, the request information may be battery state information based on at least one of the voltage, the current and the temperature for the battery cell 10, or battery pack diagnosis information based on the battery pack state information including at least one of the voltage, the current and the temperature for the battery pack 1.

The measuring step S200 is a step of measuring at least one of voltage, current and temperature of the battery cell 10 to correspond to the request information contained in the information provision request, and may be performed by the measuring unit 110.

Referring to FIG. 2, the measuring unit 110 may measure at least one of temperature, voltage and current of the battery cell 10 by using the temperature measuring unit 111, the voltage measuring unit 112 and the current measuring unit 113.

For example, if the voltage information for the battery cell 10 is contained in the information provision request received by the communication unit 120 in the information provision request receiving step (S100), the measuring unit 110 may measure the voltage of the battery cell 10 by using the voltage measuring unit 112.

The response information generating step (S300) is a step of generating at least one response information corresponding to the request information based on the measurement result measured in the measuring step (S200), and may be performed by the control unit 130.

That is, the control unit 130 may generate the response information corresponding to the request information contained in the information provision request received by the communication unit 120 by using any one of temperature, voltage and current of the battery cell 10 measured by the measuring unit 110.

The communication channel selecting step (S400) is a step of selecting any one communication channel among the plurality of communication channels based on at least one of a data amount of the generated response information and a state of the plurality of communication channels, and may be performed by the control unit 130.

Specifically, the communication unit 120 may be connected to a plurality of communication channels. The control unit 130 may select a communication channel for providing the generated response information to the receiving side in consideration of the data amount of the generated response information and the state of each of the plurality of communication channels to which the communication unit 120 may be connected.

For example, as described above, if the data amount of the generated response information is smaller than or equal to a predetermined first reference amount, the control unit 130 may be configured to select the first communication channel among the plurality of communication channels. In addition, if the data amount of the generated response information is greater than the predetermined first reference amount and is smaller than or equal to a predetermined second reference amount, the control unit 130 may select the second communication channel among the plurality of communication channels.

The message packet generating step (S500) is a step of generating a message packet corresponding to the information provision request based on the type of the selected communication channel and the data amount of the generated response information, and may be performed by the control unit 130.

The control unit 130 may generate the message packet to be output through the selected communication channel in consideration of both the type of the selected communication channel and the data amount of the generated response information. In the following, it is assumed that the predetermined first reference amount is 4 bytes and the predetermined second reference amount is 64 bytes.

For example, referring to FIG. 3, if the first communication channel is selected among the plurality of communication channels and the data amount of the generated response information is 4 bytes or less, the control unit 130 may generate a message packet in which data of 8 bytes at maximum may be recorded.

As another example, referring to FIG. 5, if the second communication channel is selected among the plurality of communication channels and the data amount of the generated response information is greater than 4 bytes, the control unit 130 may generate a message packet in which data of 64 bytes at maximum may be recorded.

As another example, referring to FIG. 7, even if the data amount of the generated response information is greater than 4 bytes, the first communication channel may be selected in consideration of the state of each of the plurality of communication channels. In this case, the control unit 130 may generate a plurality of data packets containing order information along with a message packet in which data of 8 bytes at maximum may be recorded.

Finally, the packet outputting step (S600) is a step of outputting the generated message packet through the selected communication channel, and may be performed by the control unit 130.

Specifically, the control unit 130 may control the communication unit 120 so that the generated message packet is output through the selected communication channel. That is, the message packet generated by the control unit 130 may be output through the communication channel selected by the control unit 130.

In addition, in the embodiment of FIG. 7, the control unit 130 may control the communication unit 120 so that the generated message packet and the plurality of data packets are sequentially output to the selected communication channel. That is, the message packet and the plurality of data packets generated by the control unit 130 may be output through the communication channel selected by the control unit 130.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery cell
100: battery management apparatus
110: measuring unit
120: communication unit
130: control unit
200: first ECU
300: second ECU
400: communication BUS
A: amperemeter
SL1 to SL4: first to fourth sensing lines
What is claimed is:
1. A battery management apparatus, comprising:
a communicator configured to receive an information provision request containing at least one request information about a battery cell or a battery pack;

a measurer configured to measure at least one of voltage, current, and temperature of the battery cell or the battery pack to correspond to the request information contained in the information provision request received by the communicator; and a controller configured to:

receive a measurement result measured by the measurer;

generate at least one response information corresponding to the request information based on the received measurement result;

select any one communication channel among a plurality of communication channels, based on:

a data amount of the generated response information; and an estimated transfer time for each of the plurality of communication channels to take to transfer the generated response information;

generate a message packet corresponding to the information provision request, based on a type of the selected communication channel and the data amount of the generated response information; and output the generated message packet to the selected communication channel through the communicator, wherein the controller is further configured to compare the respective estimated transfer times of the plurality of communication channels based on whether each respective communication channel, among the plurality of communication channels, is already occupied and is being used.

2. The battery management apparatus according to claim 1, wherein:

the controller is further configured to:

calculate a packet data amount requested for the message packet, based on the data amount of the generated response information; and generate the message packet to contain packet size information for the calculated packet data amount, packet identification information, and the generated response information; and the packet identification information is identification information corresponding to the information provision request.

3. The battery management apparatus according to claim 2, wherein:

the message packet includes:

a packet size information area in which the packet size information is recorded;

a packet identification information area in which the packet identification information is recorded; and a data area in which the generated response information is recorded; and the controller is further configured to determine the packet data amount, based on data amounts of the packet size information area, the packet identification information area, and the data area.

4. The battery management apparatus according to claim 3, wherein, when the response information is provided in plural, the controller is further configured to classify the plurality of response information from each other by including classification information corresponding to the number of the plurality of response information in the data area.

5. The battery management apparatus according to claim 1, wherein the plurality of communication channels includes:

a first communication channel in which a maximum data amount of response information transmittable at once is set to be equal to or smaller than a predetermined first reference amount; and a second communication channel in which a maximum data amount of response information transmittable at once is set to be equal to or smaller than a predetermined second reference amount that is greater than the predetermined first reference amount.

6. The battery management apparatus according to claim 5, wherein the controller is further configured to:

select the first communication channel, among the plurality of communication channels, if the data amount of the response information is equal to or smaller than the predetermined first reference amount; and select the second communication channel, among the plurality of communication channels, if the data amount of the response information is:

greater than the predetermined first reference amount; and equal to or smaller than the predetermined second reference amount.

7. The battery management apparatus according to claim 5, wherein the controller is further configured to:

compare the estimated transfer times, respectively estimated to be taken for the first communication channel and the second communication channel, to transmit the response information; and select a communication channel of which the estimated transfer time is shorter.

8. The battery management apparatus according to claim 7, wherein:

if the data amount of the response information is greater than the predetermined first reference amount, and the first communication channel is selected, the controller is further configured to:

generate a single message packet and a plurality of data packets;

set the order of the plurality of generated data packets; and control the communicator to sequentially output the generated message packet and the plurality of data packets through the first communication channel, based on the set order; and the data packet includes:

an order area in which the set order information is recorded; and a data area in which the response information is recorded.

9. The battery management apparatus according to claim 1, wherein the request information includes:

battery state information, based on at least one of the voltage, the current, and the temperature for the battery cell; or battery pack diagnosis information, based on at least one of the voltage, the current, and the temperature for the battery pack.

10. A battery pack, comprising the battery management apparatus according to claim 1.

11. The battery management apparatus according to claim 1, wherein:

the message packet includes a data area in which the generated response information is recorded; and when the generated response information is provided in plural, the controller is further configured to classify the plurality of generated response information from each other by including classification information corresponding to the number of the plurality of generated response information in the data area.

12. A battery management method, comprising:

an information provision request receiving operation of receiving an information provision request containing at least one request information about a battery cell or a battery pack;

a measuring operation of measuring at least one of voltage, current, and temperature of the battery cell or the battery pack to correspond to the request information contained in the information provision request;

a response information generating operation of generating at least one response information corresponding to the request information, based on a measurement result measured in the measuring operation;

a communication channel selecting operation of selecting any one communication channel, among a plurality of communication channels, based on:

a data amount of the generated response information; and an estimated transfer time for each of the plurality of communication channels to take to transfer the generated response information;

a message packet generating operation of generating a message packet corresponding to the information provision request, based on a type of the selected communication channel and the data amount of the generated response information; and a packet outputting operation of outputting the generated message packet to the selected communication channel, wherein the communication channel selecting operation includes comparing the respective estimated transfer times of the plurality of communication channels based on whether each respective communication channel, among the plurality of communication channels, is already occupied and is being used.

13. The battery management method of claim 12, wherein:

the message packet generating operation includes:

calculating a packet data amount requested for the message packet, based on the data amount of the generated response information; and generating the message packet to contain packet size information for the calculated packet data amount, packet identification information, and the generated response information; and the packet identification information is identification information corresponding to the information provision request.

14. The battery management method of claim 13, wherein:

the message packet includes:

a packet size information area in which the packet size information is recorded;

a packet identification information area in which the packet identification information is recorded; and a data area in which the generated response information is recorded; and the calculating of the packet data amount includes determining the packet data amount, based on data amounts of the packet size information area, the packet identification information area, and the data area.

15. The battery management method of claim 14, wherein the message packet generating operation further includes, when the response information is provided in plural, classifying the plurality of response information from each other by including classification information corresponding to the number of the plurality of response information in the data area.

16. The battery management method of claim 12, wherein the plurality of communication channels includes:

a first communication channel in which a maximum data amount of response information transmittable at once is set to be equal to or smaller than a predetermined first reference amount; and a second communication channel in which a maximum data amount of response information transmittable at once is set to be equal to or smaller than a predetermined second reference amount that is greater than the predetermined first reference amount.

17. The battery management method of claim 16, wherein the communication channel selecting operation includes:

selecting the first communication channel, among the plurality of communication channels, if the data amount of the response information is equal to or smaller than the predetermined first reference amount; and selecting the second communication channel, among the plurality of communication channels, if the data amount of the response information is:

greater than the predetermined first reference amount; and equal to or smaller than the predetermined second reference amount.

18. The battery management method of claim 16, wherein the communication channel selecting operation includes:

comparing the estimated transfer times, respectively estimated to be taken for the first communication channel and the second communication channel, to transmit the response information; and selecting a communication channel of which the estimated transfer time is shorter.

19. The battery management method of claim 18, wherein:

the message packet generating operation further includes, if the data amount of the response information is greater than the predetermined first reference amount, and the first communication channel is selected:

generating a single message packet and a plurality of data packets;

setting the order of the plurality of generated data packets; and sequentially outputting the generated message packet and the plurality of data packets through the first communication channel, based on the set order; and the data packet includes:

an order area in which the set order information is recorded; and a data area in which the response information is recorded.

20. The battery management method of claim 12, wherein the request information includes:

battery state information, based on at least one of the voltage, the current, and the temperature for the battery cell; or battery pack diagnosis information, based on at least one of the voltage, the current, and the temperature for the battery pack.

21. The battery management method of claim 12, wherein:

the message packet includes a data area in which the generated response information is recorded; and the message packet generating operation further includes, when the generated response information is provided in plural, classifying the plurality of generated response information from each other by including classification information corresponding to the number of the plurality of generated response information in the data area.

* * * * *